United States Patent [19]
Choi et al.

[11] Patent Number: 6,089,763
[45] Date of Patent: Jul. 18, 2000

[54] SEMICONDUCTOR WAFER PROCESSING SYSTEM

[75] Inventors: Jin-Young Choi; Hee-Young Kang, both of Chungchongnam-do; Kyung-Dae Park, Kyonggi-do; Tae-Su Kim, Chungchongnam-do; Jun-Seong Lee, Kyonggi-do; Dong-Ho Kim, Chungchongnam-do; Sung-Yun Kang, Kyonggi-do; Jai-Moon Ryu, Chungchongnam-do; Han-Kil Kang, Seoul, all of Rep. of Korea

[73] Assignee: DNS Korea Co., Ltd., Cheonan, Rep. of Korea

[21] Appl. No.: 09/139,270

[22] Filed: Aug. 25, 1998

[30] Foreign Application Priority Data

| Sep. 9, 1997 | [KR] | Rep. of Korea | 97-46236 |
| Sep. 9, 1997 | [KR] | Rep. of Korea | 97-46237 |
| Sep. 9, 1997 | [KR] | Rep. of Korea | 97-46238 |
| Sep. 9, 1997 | [KR] | Rep. of Korea | 97-46239 |
| Sep. 9, 1997 | [KR] | Rep. of Korea | 97-46240 |
| Sep. 9, 1997 | [KR] | Rep. of Korea | 97-46241 |
| Sep. 9, 1997 | [KR] | Rep. of Korea | 97-46242 |
| May 12, 1998 | [KR] | Rep. of Korea | 98-16904 |

[51] Int. Cl.$^7$ ............................ G03D 5/00; H01L 21/00
[52] U.S. Cl. ................... 396/611; 396/570; 396/627; 414/225; 414/935
[58] Field of Search ................. 396/604, 611, 396/624, 627, 630, 570, 578; 414/152, 225, 935, 941; 430/30; 355/27, 53

[56] References Cited

U.S. PATENT DOCUMENTS

| 4,647,172 | 3/1987 | Batchelder et al. | 396/570 |
| 5,028,955 | 7/1991 | Hayashida et al. | 355/53 |
| 5,664,254 | 9/1997 | Ohkura et al. | 396/611 |
| 5,762,745 | 6/1998 | Hirose | 396/611 |
| 5,826,129 | 10/1998 | Hasebe et al. | 396/611 |
| 5,928,390 | 7/1999 | Yaegashi et al. | 29/25.01 |

*Primary Examiner*—Alan A. Mathews

[57] ABSTRACT

A semiconductor wafer processing system having a multi-layered arrangement of wafer processing units included in a spinner to carry out photoresist coating and developing processes for the formation of micro patterns on semiconductor wafers, thereby enabling an easy increase in those processing units coping with an introduction of new processes without increasing the occupying space of the processing units, while being capable of achieving accurate wafer feeding and loading operations, and minimizing the consumption of a chemical solvent coated over wafers. The system includes groups of modules each being selected from first and second modules. The first module includes a plurality of bake units each having bake boxes arranged in a multi-layered fashion, the bake units being arranged adjacent to one another in the wafer feeding direction, and a spin unit, such as a spine coater or a spine developer, fixedly mounted on the bake units. The second module includes a plurality of wafer edge exposure units arranged in a multi-layered fashion while being arranged in such a fashion that they are adjacent to one another in the wafer feeding direction, and a spin unit fixedly mounted on the wafer edge exposure units. Each module group constitute a station, together with a feeding robot. A feeing interface or buffer stocker is arranged between adjacent stations.

16 Claims, 13 Drawing Sheets

SEMICONDUCTOR WAFER PROCESSING SYSTEM

BACKGROUND OF THE INVENTION

1. Field of the Invention

The present invention relates to a system for processing semiconductor wafers, and more particularly to a semiconductor wafer processing system having a multi-layered arrangement of wafer processing units included in a spinner to carry out photoresist coating and developing processes for the formation of micro patterns on semiconductor wafers, thereby enabling an easy increase in those processing units coping with an introduction of new processes without increasing the occupying space of the processing units, while having a configuration capable of achieving accurate wafer feeding and loading operations, and minimizing the consumption of a chemical solvent coated over wafers.

2. Description of the Prior Art

As well known, a photo-lithography process is an important process in the processing of semiconductor wafers. Such a photo-lithography process is carried out using an integrated coating and developing installation which performs a coating process for coating a photoresist solution over a wafer, a baking process for the coated photoresist, and a developing process for the baked photoresist. The integrated coating and developing installation is connected with a stepper in an in-line manner via an interface. Such an integrated coating and developing installation is an important device for the formation of micro patterns on wafers, namely, the fabrication of highly integrated semiconductor devices.

Meanwhile, a variety of new techniques requiring an introduction of new processes have also been proposed for the fabrication of semiconductor devices with a super integration degree. Furthermore, the recent trend to use wafers with an increased size has resulted in an increase in the scale of wafer processing installations and a complexity in the arrangement of wafer processing installations.

FIGS. 1a and 1b are a perspective view and a plan view respectively illustrating a general spinner. As shown in FIGS. 1a and 1b, the spinner includes an indexer 1 for carrying out wafer loading and unloading operations, a feeding robot 2 for feeding a loaded wafer to processing units, respectively, a spin coater 3 for coating a photoresist solution over the wafer, and a spin developer 4 for developing the wafer subjected to a light exposure. A bake unit 5 is also provided which includes a hot plate 11 and a cool plate 12 respectively adapted to heat and cool the wafer before or after the photoresist coating or developing process. The spinner further includes a wide expose edge (WEE) unit 6 for exposing to light an unnecessary portion of the photoresist disposed on the peripheral edge portion of the wafer, and an interface 7 provided with a stocker interacting with an additional stepper 8 arranged adjacent to the WEE unit 6.

Although such a conventional installation may have a variable combination of processing units in accordance with processes to be carried out, it requires a relatively large installation area occupying a large portion of the entire semiconductor fabrication line because most processing units thereof are arranged in a planar manner, as shown in FIG. 1b or 1c.

For this reason, additions of processing units and new installations, involved due to an introduction of new processes and use of wafers increased in diameter, result in requirement of an increased installation area. This results in an increase in the area to be managed. Such an increase in the area to be managed results in an increase in manufacturing costs because the semiconductor fabrication line should essentially be in a super-clean environment. Furthermore, the entire fabrication line should be modified in design due to the introduction of new processes and the use of additional processing units or increased installation area caused by the use of enlarged wafers.

In order to solve such problems, a variety of techniques have been proposed. For example, a technique has been proposed in which a single feeding means is used to feed a workpiece (namely, a wafer) from a designated area to processing chambers. In accordance with this technique, a plurality of processing chambers are arranged in a multi-layered fashion around the feeding means in order to reduce the entire installation area.

Where this technique is applied to the fabrication of highly integrated semiconductor products of a 64 Mega grade or higher, requiring increased numbers of spin coaters, spin developers and bake units, it is inevitably necessary for those processing units to be arranged on three layers or more in order to achieve desired processes in each processing station using the single feeding means.

In the case of compact processing units such as bake units, a relatively easy multi-layered arrangement is achieved. However, where bulky processing units such as spin coaters or spin developers, which are important units for the processing of wafers, are arranged in a multi-layered fashion on three floors or more, the installation has a height of 3.5 m or more. For this reason, there is a great difficulty in the manufacture, repair, and maintenance of the installation. Furthermore, abnormal spaces are required on the semiconductor fabrication line which requires a super-clean state. For this reason, there is a problem in that the entire semiconductor fabrication line should be modified or newly designed.

Moreover, the single feeding means may be overloaded in the process of loading wafers into a plurality of processing chambers (at least 15 processing chambers) arranged in a multi-layered fashion around the feeding means or unloading wafers from those processing chambers. In this case, a degradation in the efficiency of the installation and a degradation in productivity may occur. In addition, there is a limitation in the space for occupying a variety of processing units required for the fabrication of semiconductor products with a super integration degree. Such a limited occupying space results in a great limitation in the use of processing units respectively required for achieving a variety of processes.

SUMMARY OF THE INVENTION

The present invention has been made in view of the above mentioned problems involved in conventional integrated coating and developing installations for semiconductor wafers, and an object of the invention is to provide a semiconductor wafer processing system capable of minimizing the area for occupying processing units even when an addition of processing units is required due to an introduction of new processes and use of wafers increased in diameter.

Another object of the invention is to provide a semiconductor wafer processing system including a plurality of robot arms selectively operating to accurately feed a wafer and to accurately load the fed wafer on a desired position, thereby being capable of preventing a degradation in the quality of products due to a feeding delay and an inaccurate loading.

Another object of the invention is to provide a semiconductor wafer processing system capable of controlling the amount of a solvent supplied upon coating a photoresist solution over a wafer while controlling the rotating speed of the wafer, thereby achieving an improvement in the stability and reliability of the coating process and a minimized consumption of the solvent.

In accordance with the present invention, these objects are accomplished by providing a semiconductor wafer processing system comprising groups of modules each being selected from first and second modules. The first module includes a plurality of bake units each having a plurality of bake boxes arranged in a multi-layered fashion, the bake units being arranged in such a fashion that they are adjacent to one another in the wafer feeding direction, and a spin unit, such as a spine coater or a spine developer, fixedly mounted on the bake units. The second module includes a plurality of wafer edge exposure units arranged in a multi-layered fashion while being arranged in such a fashion that they are adjacent to one another in the wafer feeding direction, and a spin unit, such as a spine coater or a spine developer, fixedly mounted on the wafer edge exposure units. Each module group constitutes a station, together with a feeding robot. A feeding interface or buffer stocker is arranged between adjacent stations.

Accordingly it is possible to minimize the area for occupying processing units even when an addition of processing units is required due to an introduction of new processes and use of wafers increased in diameter. It is also possible to accurately feed a wafer and to accurately load the fed wafer on a desired position. The semiconductor wafer processing system can also efficiently carry out a photoresist coating operation, thereby achieving an improvement in productivity.

BRIEF DESCRIPTION OF THE DRAWINGS

Other objects and aspects of the invention will become apparent from the following description of embodiments with reference to the accompanying drawings in which:

FIGS. 5b and 5c are a plan view and a cross-sectional view respectively illustrating an operation of the feeding arm shown in FIG. 5a;

FIG. 6 is a plan view illustrating another embodiment of the feeding arm shown in FIG. 5a;

DESCRIPTION OF THE PREFERRED EMBODIMENTS

Figure 1A:
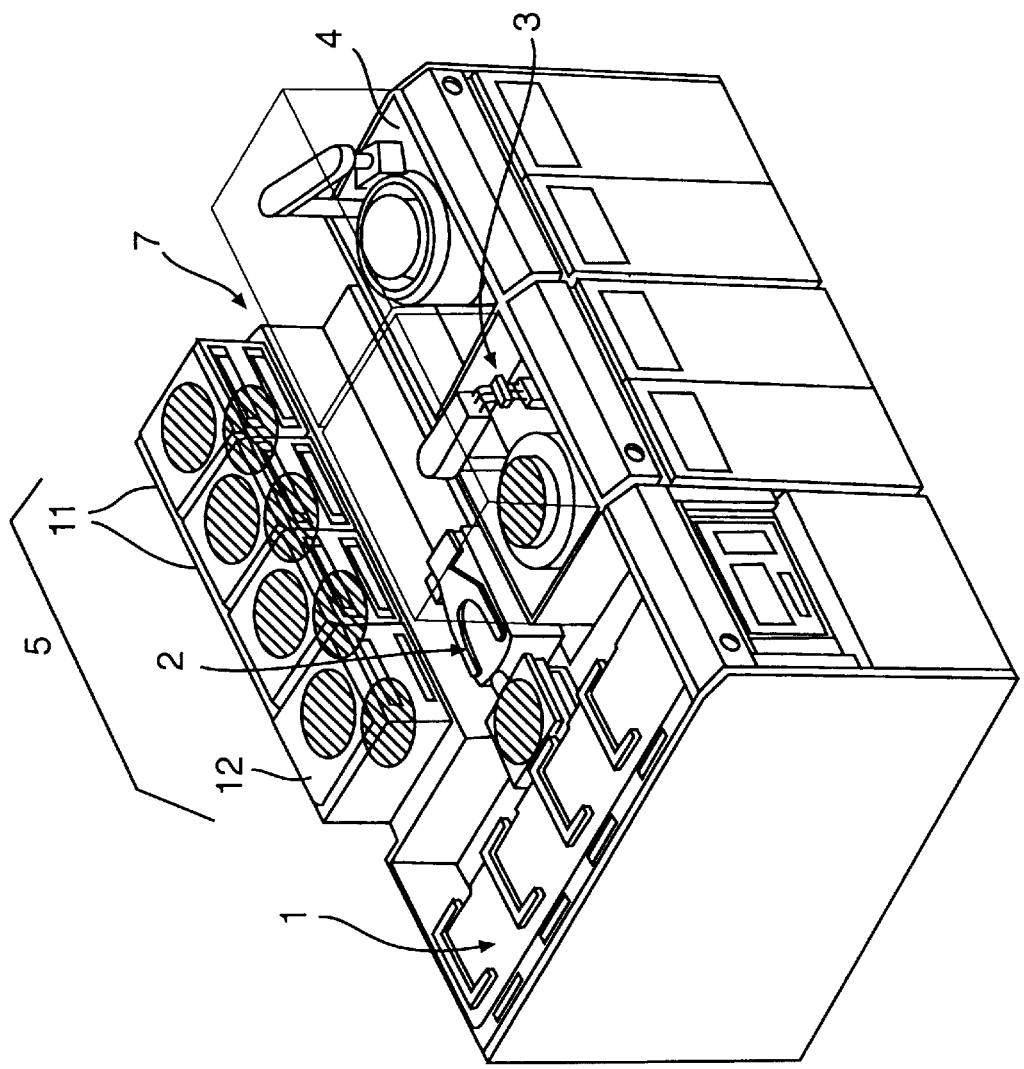
FIGS. 1a and 1b are a perspective view and a plan view respectively illustrating a general spinner.
Figure 1B:
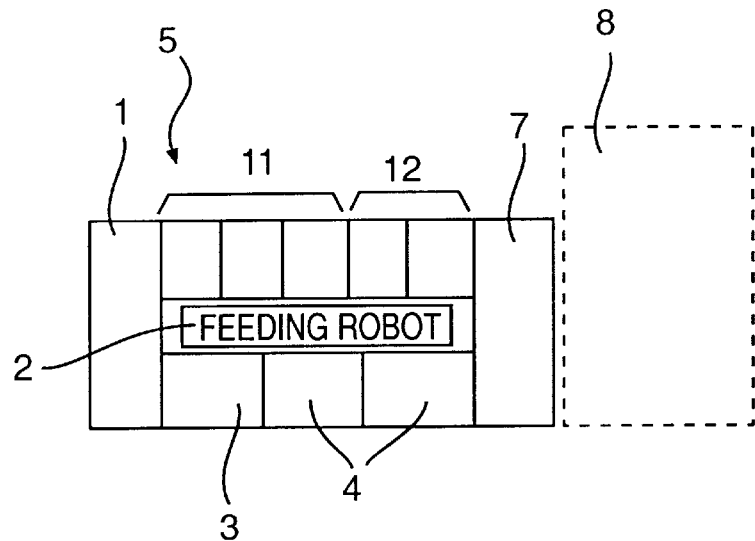
Figure 1C:
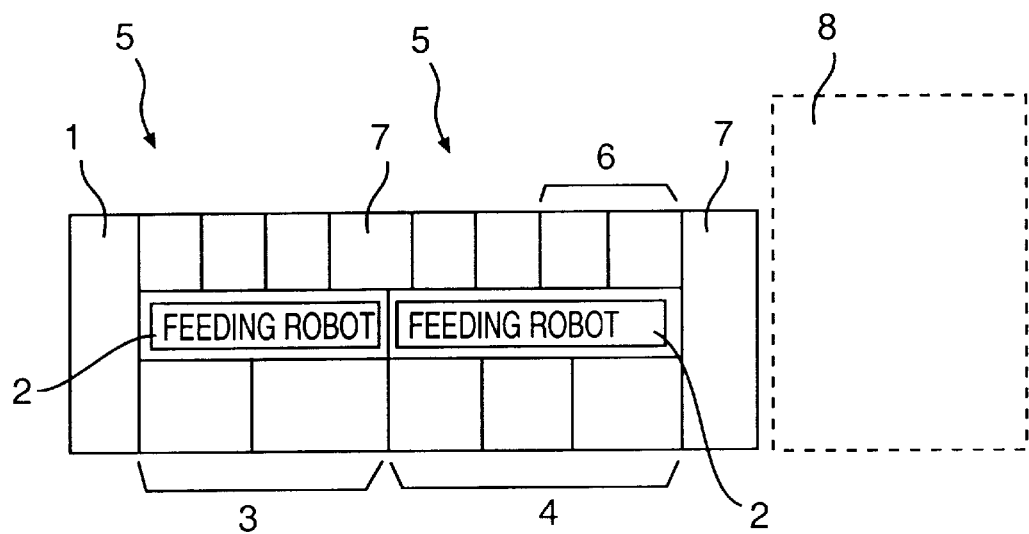
FIG. 1c is a plan view illustrating another spinner.

Referring to FIG. 1a, an example of a spinner, namely, an integrated installation for coating a photoresist solution over a semiconductor wafer, and developing the coated photoresist, is illustrated to which the present invention is applied. As described above in conjunction with FIG. 1a, the spinner includes an indexer 1 for carrying out wafer loading and unloading operations, a feeding robot 2 for feeding a loaded wafer to processing units, respectively, a spin coater 3 for coating a photoresist solution over the wafer, and a spin developer 4 for developing the wafer subjected to a light exposure, a bake unit 5 provided with hot plates 11 and cool plates 12 respectively adapted to heat and cool the wafer before or after the photoresist coating or developing process, a WEE unit 6 for exposing to light an unnecessary portion of the photoresist disposed on the peripheral edge portion of the wafer, and an interface 7 provided with a stocker interacting with an additional stepper 8 arranged adjacent to the WEE unit 6.

Figure 2:
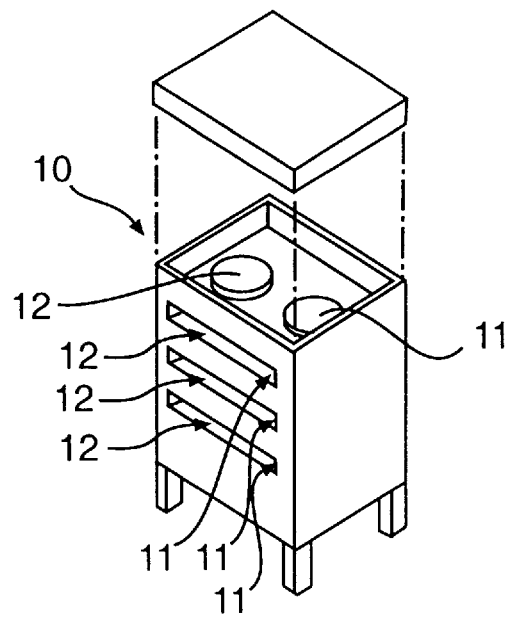
FIG. 2 is a perspective view schematically illustrating a bake unit applicable to the spinners in accordance with an embodiment of the present invention.

FIG. 2 schematically illustrates a bake unit applicable to the above mentioned spinner in accordance with an embodiment of the present invention. As shown in FIG. 2, the bake unit, which is denoted by the reference numeral 10, includes a plurality of bake boxes arranged in a multi-layered fashion. In each bake box, a pair of plates are arranged side by side with each other. The plates arranged in each bake box may include a hot plate 11 adapted to heat a wafer fed to the bake box and a cool plate 12 adapted to cool the wafer, as shown in FIG. 2. Alternatively, both plates arranged in each bake box may include hot plates 11 or cool plates 12.

Taking the management of the bake unit 10 into consideration, it is preferred that the number of multi-layered bake boxes in the bake unit 10 be ten or less. Since the bake unit 10 consists of bake boxes arranged in a multi-layered fashion, the area occupied by the bake unit 10 can be minimized. Furthermore, there is no increase in the area occupied by the bake unit 10 when the hot and cool plates 11 and 12 of the bake unit 10 should increase in number to increase the capacity of the bake unit 10. This is because the increase in the capacity of the bake unit 10 can be accomplished by simply layering, in the bake unit 10, additional bake boxes containing the increased number of hot and cool plates 11 and 12. Even when two or more bake units 10 should be used, it is possible to minimize an increase in the area occupied by those bake units 10 by virtue of the above mentioned multi-layered arrangement.

Figure 3A:
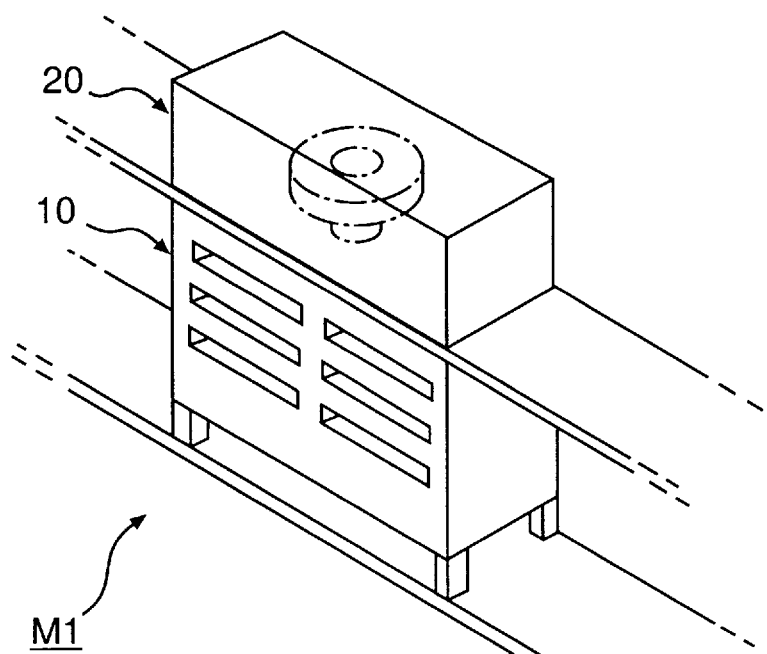
FIGS. 3a and 3b are perspective views respectively illustrating a module configured by bake units and a spin coater or spin developer and a module configured by WEE units and a spin coater or spin developer.

FIG. 3a illustrates a module consisting of a plurality of bake units and a spin coater or spin developer laid on the bake units. The module of FIG. 3a, namely, a first module M1, includes two bake units 10 arranged adjacent to each other, and a spin unit 20 fixedly mounted on the bake units 10. The spin unit 20 consists of a spin coater or spin developer. If necessary, the first module M1 may have an increased number of bake units 10. Each bake unit 10 includes a plurality of bake boxes arranged in a multi-layered fashion.

Since the first module M1 consists of a plurality of bake units 10 arranged adjacent to one another, each bake unit 10 consisting of multi-layered bake boxes, and the spin unit 20 laid on the bake units 10, it is possible to minimize an increase in installation area caused by the provision of additional processing units, namely, additional bake units 10. By such an arrangement, it is also possible to minimize the movement range of the feeding robot moving among processing units. This results in a reduction in operating time and an improvement in performance.

Figure 3B:
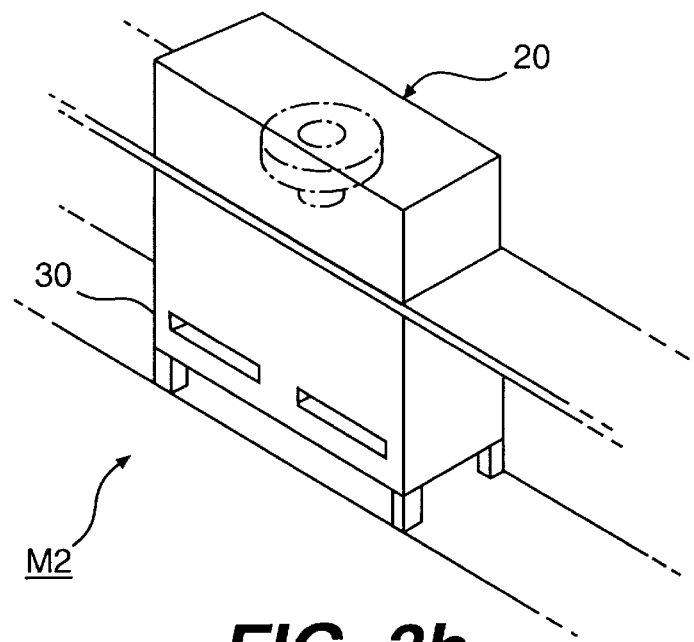

FIG. 3b illustrates a module consisting of a plurality of WEE units and a spin coater or spin developer laid on the units. The module of FIG. 3b, namely, a second module M2, includes two WEE units 30 arranged adjacent to each other, and a spin unit 20 fixedly mounted on the WEE units 30. The spin unit 20 consists of a spin coater or spin developer. If necessary, the second module M2 may have an increased number of WEE units 30 arranged in a multi-layered fashion.

Since the second module M2 consists of a plurality of WEE units 30, which may be arranged adjacent to one another while also being arranged in a multi-layered fashion, it is possible to minimize an increase in installation area caused by the provision of additional processing units, namely, additional WEE units 30. By such an arrangement, it is also possible to achieve a reduction in operating time and an improvement in performance.

Figure 4:
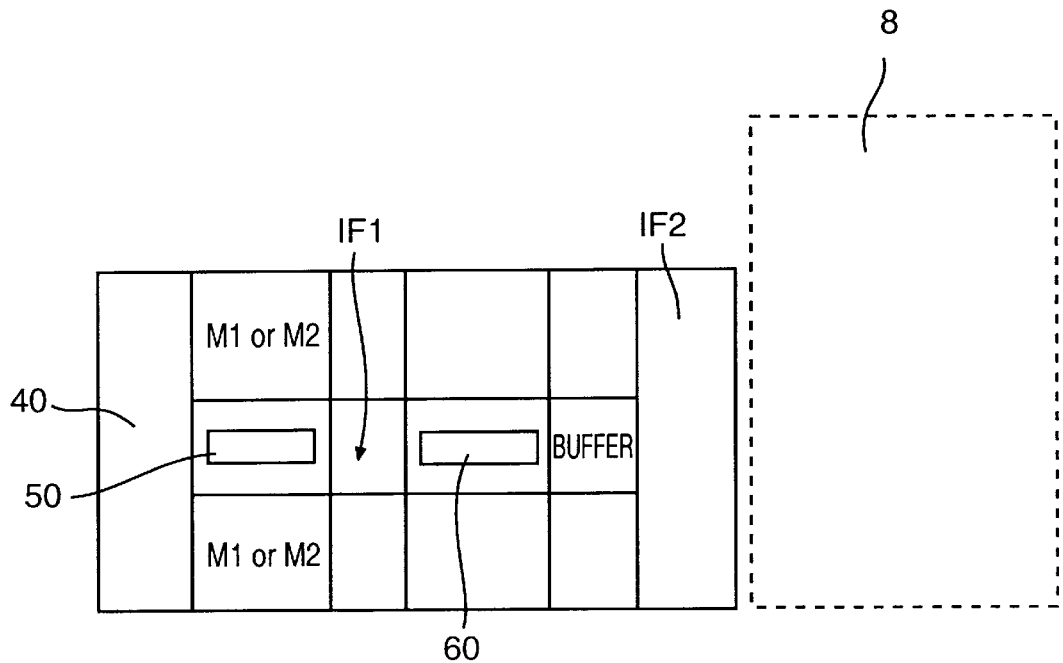
FIG. 4 is a plan view illustrating a semiconductor wafer processing system in which the modules of FIGS. 3a and 3b are incorporated in accordance with the present invention.

FIG. 4 is a plan view illustrating a semiconductor wafer processing system in which the above mentioned modular units are incorporated in accordance with the present invention. As shown in FIG. 4, a first robot 50 is arranged downstream from an indexer 40 adapted to carry out wafer loading and unloading operations. The first robot 50 serves to feed a wafer loaded by the indexer 40 to a desired processing unit. Modules are arranged in opposite sides of the first robot 50, respectively. The modules may include first and second modules M1 and M2 respectively having the above mentioned configurations. Alternatively, the modules may be first modules M1 or second modules M2.

A second robot 60 is arranged downstream from the first robot 50 in such a fashion that it is aligned with the first robot 50. A first interface IF1 is arranged between the first and second robots 50 and 60. Modules are arranged in opposite sides of the second robot 60, respectively. The modules may include first and second modules M1 and M2 respectively having the above mentioned configurations. Alternatively, the modules may be first modules M1 or second modules M2. Downstream from the second robot 60, a stepper 70 is arranged which serves to expose the entire portion of a wafer coated with photoresist. A buffer stocker and a second interface IF2 are arranged between the second robot 60 and the stepper 70.

In accordance with the present invention, the semiconductor wafer processing system includes at least two wafer processing stations having the above mentioned basic arrangement. That is, each wafer processing station includes a feeding means, and modules arranged in opposite sides of the feeding means. Each wafer processing station may include at least two modules arranged in a multi-layered fashion in each side of the feeding means. The modules arranged in each side of the feeding means may include first and second modules M1 and M2 respectively having the above mentioned configurations. Alternatively, the modules may be first modules M1 or second modules M2. A feeding interface or buffer stocker is arranged between adjacent stations. By such an arrangement, the occupying area of the entire installation can be minimized. In addition, it is possible to efficiently achieve the entire process.

Figure 5A:
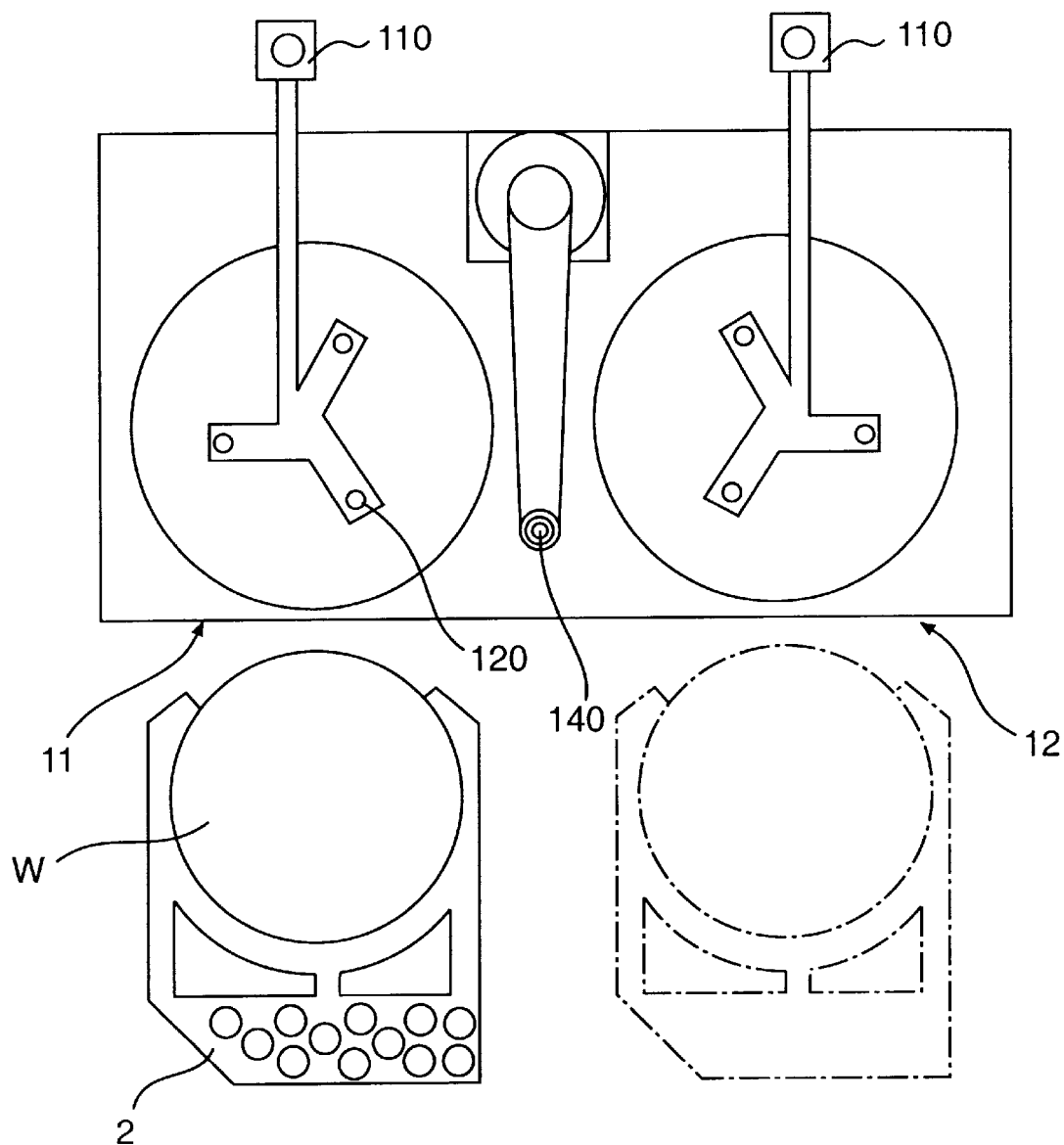
FIG. 5a is a plan view illustrating a feeding arm adapted to feed a wafer to each bake unit in accordance with the present invention.
Figure 5B:
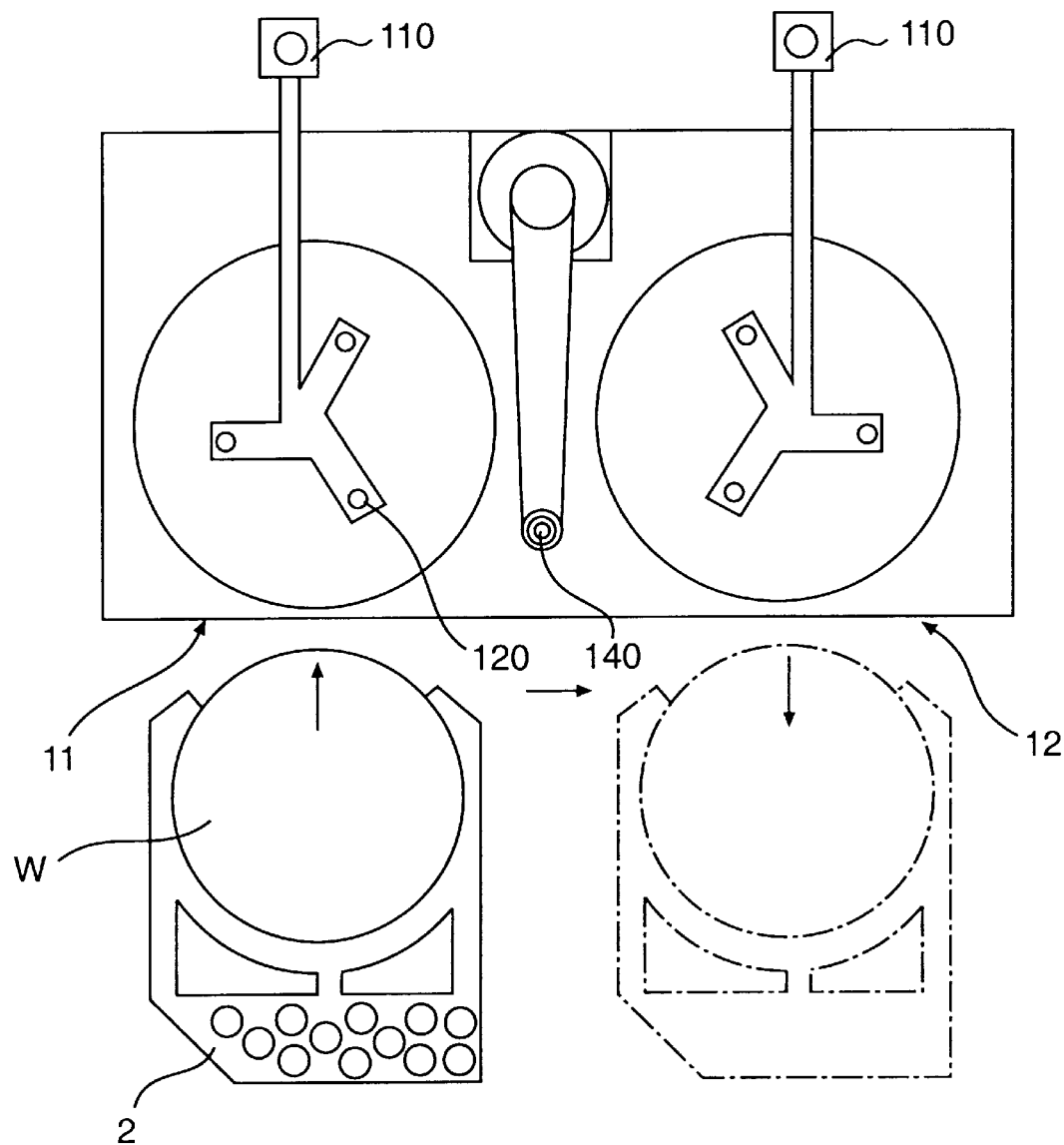
Figure 5C:
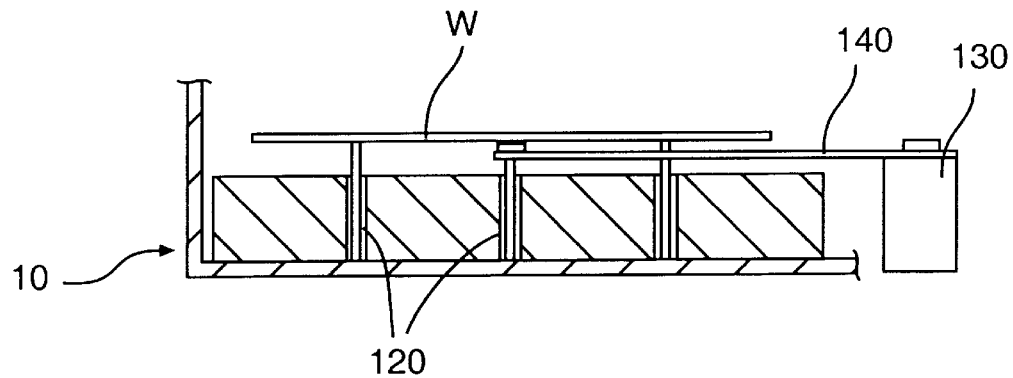

FIG. 5a illustrates a feeding arm adapted to feed a wafer to each bake unit in accordance with the present invention. FIGS. 5b and 5c are a plan view and a cross-sectional view respectively illustrating an operation of the feeding arm shown in FIG. 5a. Referring to FIG. 5a, a bake unit 10 is illustrated which includes a pair of plates, namely, the hot and cool plates 11 and 12. For each of the hot and cool plates 11 and 12, a plurality of support pins 120 are arranged in such a fashion that they move vertically through vertical holes provided at the plate to vertically move a wafer between a position, in which the wafer is loaded on the plate, and a position, in which the wafer is unloaded from the plate. The vertical movement of the support pins 120 for each plate is achieved by a reciprocal operation of a cylinder 110 connected to the support pins 120. The feeding robot 2, which serves to carry out loading and unloading operations for wafers, is arranged in the vicinity of the bake units 10.

The feeding arm, which is denoted by the reference numeral 140, is arranged in a space defined between the hot and cool plates 11 and 12. The feeding arm 140 is independently driven by a separate drive means 130 so that it moves pivotally between the hot and cool plates 11 and 12. A wafer holding member is provided at a free end of the feeding arm 140.

Preferably, the wafer holding member has a configuration capable of holding a wafer by sucking the central portion of the lower surface of the wafer using vacuum pressure. Alternatively, the wafer holding member may have a configuration capable of gripping the peripheral portion of the wafer at opposite sides of the wafer. The feeding arm 140 moves between the hot and cool plates 11 and 12 to feed a wafer under the condition in which the wafer is held by the wafer holding member.

In the illustrated case, a wafer, which is denoted by the reference character W, is first fed by the feeding arm 140 to the hot plate 11 which serves to heat the wafer W at a set temperature for a set time. Just after the heating process is completed, the wafer W is fed to the cool plate 12 by the feeding arm 140 so that it is subjected to a subsequent cooling process. The feeding of the wafer W is carried out irrespective of the operation of the feeding robot 2. Accordingly, it is possible to allow the wafer W to wait safely for a subsequent process in a state laid on the cool plate 12.

Figure 5D:
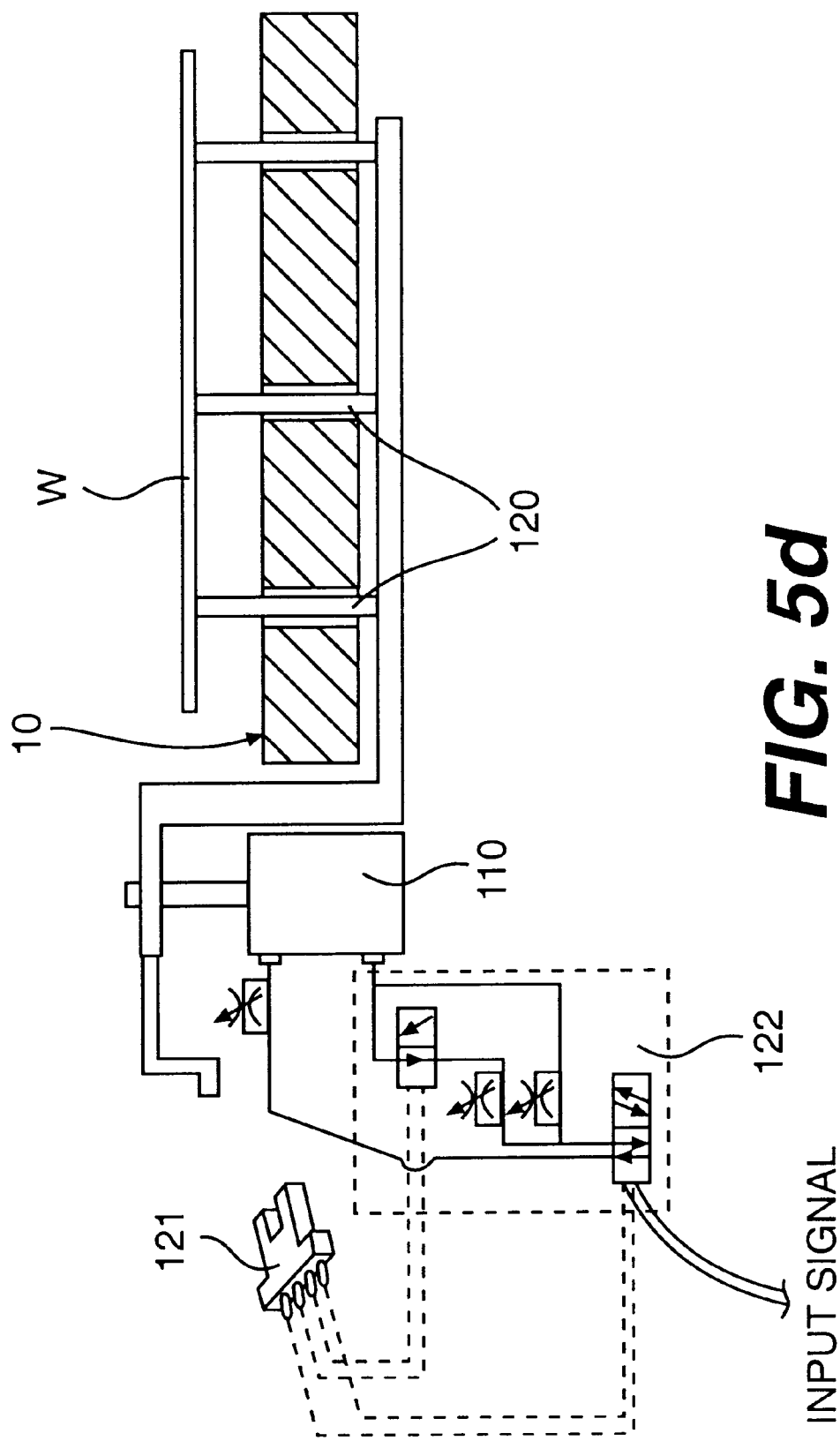
FIG. 5d is a view schematically illustrating means for controlling wafer supporting pins adapted to load a wafer on each plate of a bake unit.

As shown in FIG. 5d, the support pins 120, which extend vertically through the hot and cool plates 11 and 12, thereby supporting the wafer W in a horizontal state in accordance with a vertical movement of the cylinder 110, is controlled by a controller 122. A position sensor 121, which serves to sense a moved position of the support pins 120, is electrically coupled to the controller 122. The controller 122 generates a control signal for controlling the support pins 120, based on a signal from the position sensor 121 indicative of the moved position of the support pins 120. Preferably, the controller 122 controls the vertical movement of the support pins 120 in such a fashion that the support pins 120 supporting the wafer W move at a high speed at the initial stage of their downward movement for loading the wafer W on the hot or cool plate while moving at a low speed at a stage of the downward movement just before the wafer W comes into contact with the plate. The support pins 120 are also controlled to move at a high speed when they are separated from the wafer W. In accordance with such a controlled movement of the support pins 120, it is possible to prevent the wafer from being horizontally slipped or shifted due to air resistance when it is seated on the hot or cool plate, thereby accurately loading the wafer on a desired position.

Figure 6:
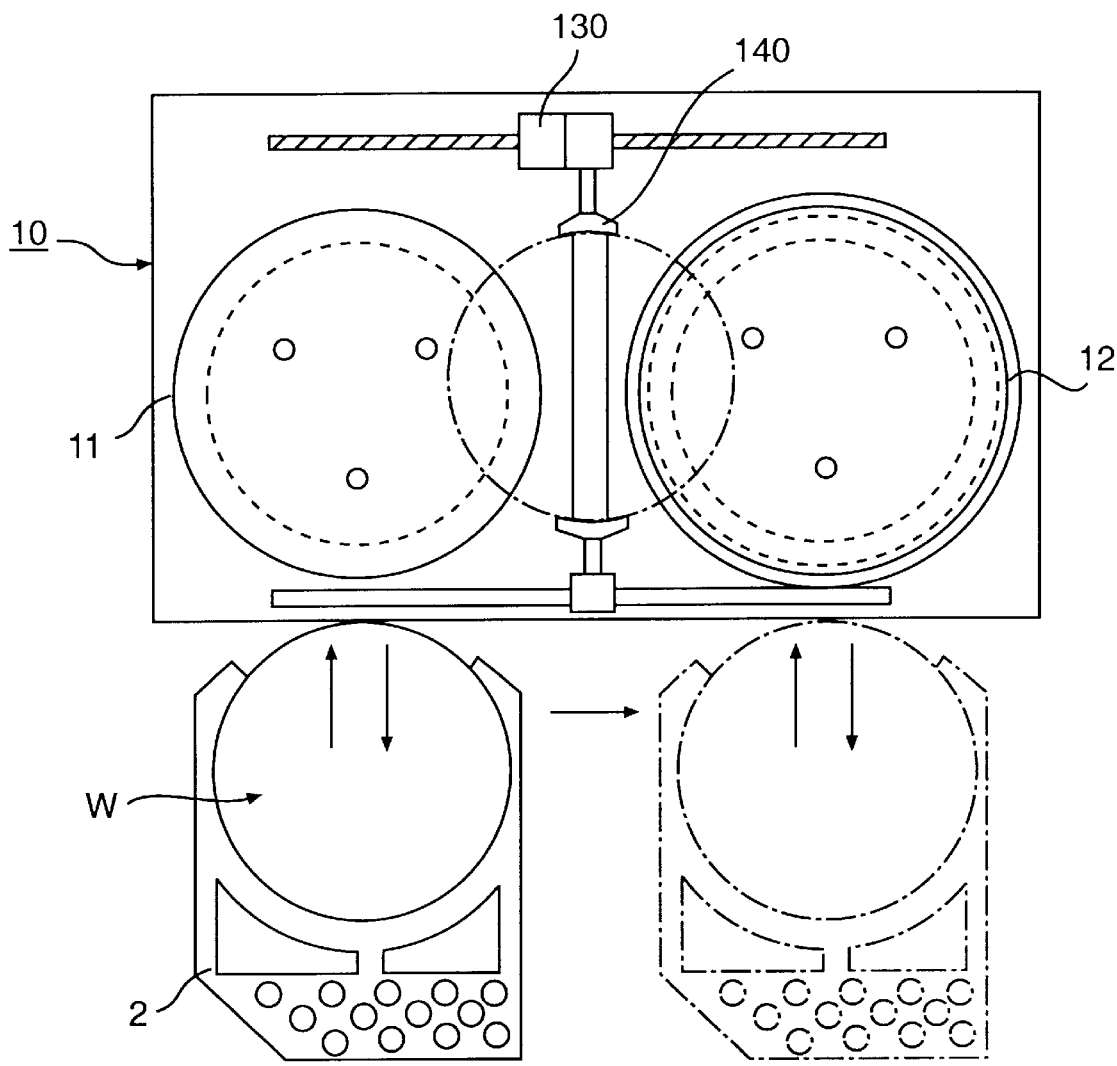

FIG. 6 illustrates another embodiment of the feeding arm. Referring to FIG. 6, a feeding arm 140 is illustrated which slides between the hot and cool plates 11 and 12 by the drive means 130 along guides respectively arranged in opposite sides of the hot and cool plates 11 and 12. Only one guide may be provided which is arranged in one side of the hot and cool plates 11 and 12.

The wafer W, which has been completely subjected to heating and cooling processes on the hot and cool plates 11 and 12 of the bake unit 10, waits a desired time in the interior of the bake unit 10 until a subsequent wafer is fed to the bake unit 10. During the waiting of the wafer W, the inner temperature of the bake unit 10 is transferred to the wafer W. Such a thermal transfer influences the yield of final products. Therefore, it is important to maintain the wafer W at a desired temperature during its waiting state, in terms of the quality.

Figure 7:
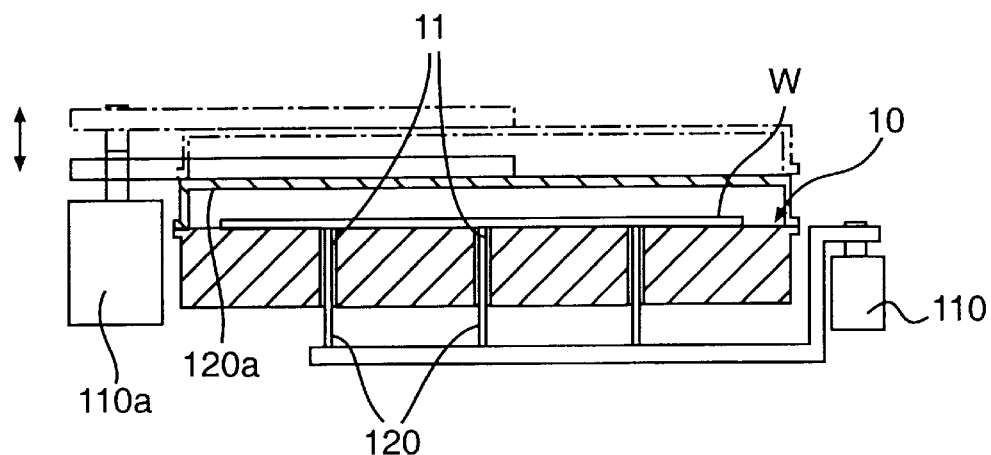
FIG. 7 is a sectional view illustrating the opened and closed states of each plate of the bake unit achieved by a cover member.

To this end, cover members 120a are provided for the hot and cool plates in accordance with the present invention, as shown in FIG. 7, so as to prevent ambient air from being introduced into the interior of the bake unit 10 during the waiting period of the wafer W. Each cover member 120a is arranged above the hot or cool plate to move vertically with respect to the plate in accordance with an operation of a separate cylinder 110a, thereby opening and closing the plate. The cylinder 110a operates independently of the cylinder 110 adapted to drive the support pins 120.

Each cover member 120a is maintained at a position, where it opens the associated plate, when the wafer loading or unloading operation is carried out. During the waiting period of the wafer W, the cover member 120a is maintained at a position where it closes the associated plate. Thus, the cover member 120a maintains the associated wafer in a heated or cooled state without causing any variation in the heated or cooled temperature of the wafer. Accordingly, it is possible to achieve an improvement in the yield of final products.

Figure 8:
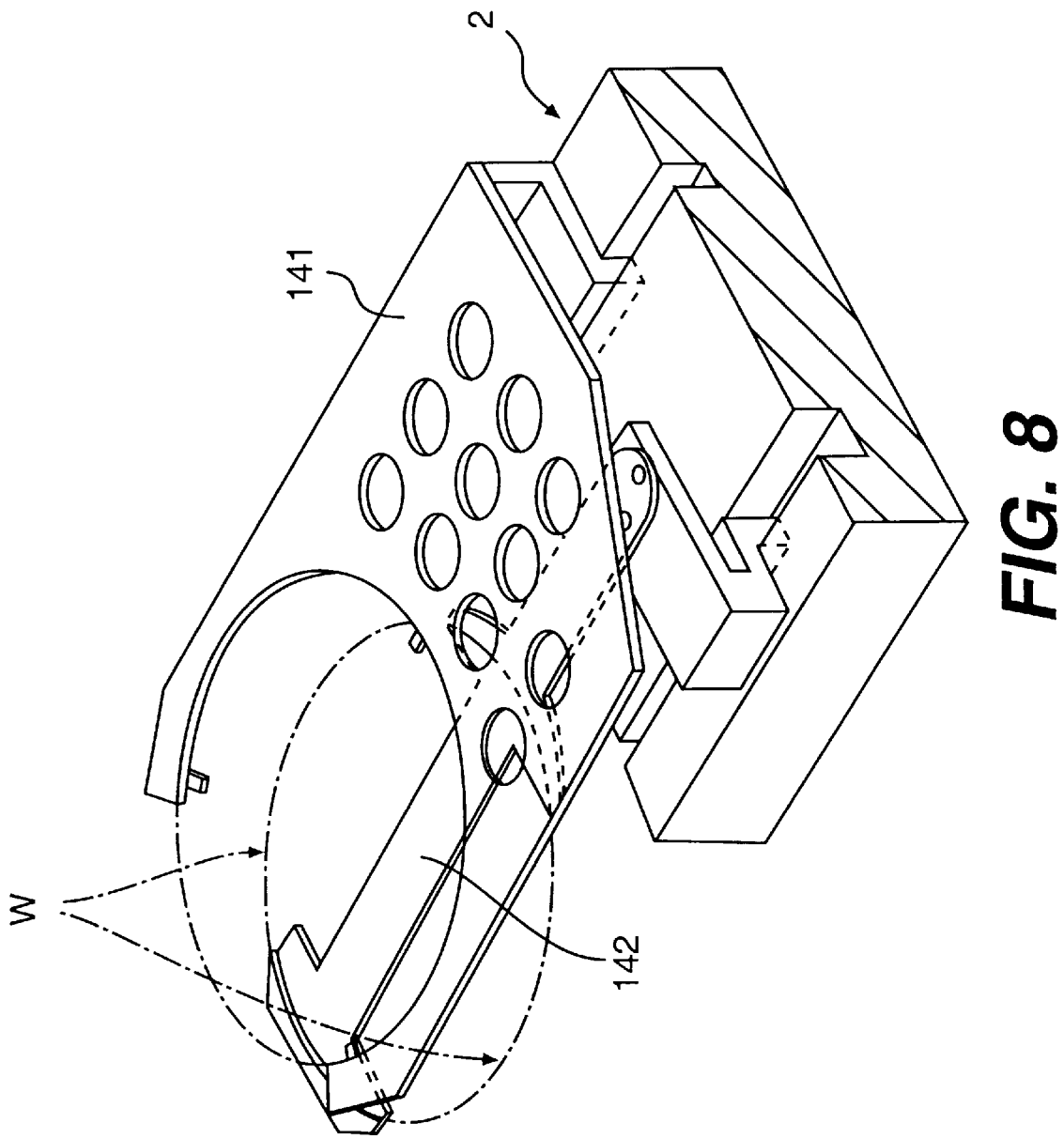
FIG. 8 is a perspective view illustrating a detailed configuration of a feeding robot provided with wafer feeding arms.

FIG. 8 is a perspective view illustrating a detailed configuration of the feeding robot 2 which is provided with wafer feeding arms. As shown in FIG. 8, the feeding robot 2, which moves to feed a wafer to a set position for each unit of the spinner, thereby loading the wafer to the set position or unloading the wafer from the set position, includes a pair of wafer feeding arms 141 and 142 each adapted to feed a wafer while holding the wafer. The wafer feeding arm 141 has a plate shape and serves to support the peripheral portion of a wafer whereas the wafer feeding arm 142 has a bar shape and serves to support the portion of the wafer extending diametrically through the center of the wafer. In accordance with the characteristics of a processing unit, in which a wafer is loaded, a selected one of the wafer feeding arms 141 and 142 operates to feed the wafer.

By such a configuration, it is unnecessary to replace the wafer feeding arms of the feeding robot with new ones in accordance with the characteristics of support means or processing units. This is possible by virtue of the use of a selected one of the wafer feeding arms. Accordingly, it is possible to enhance the wafer feeding efficiency.

Figure 9:
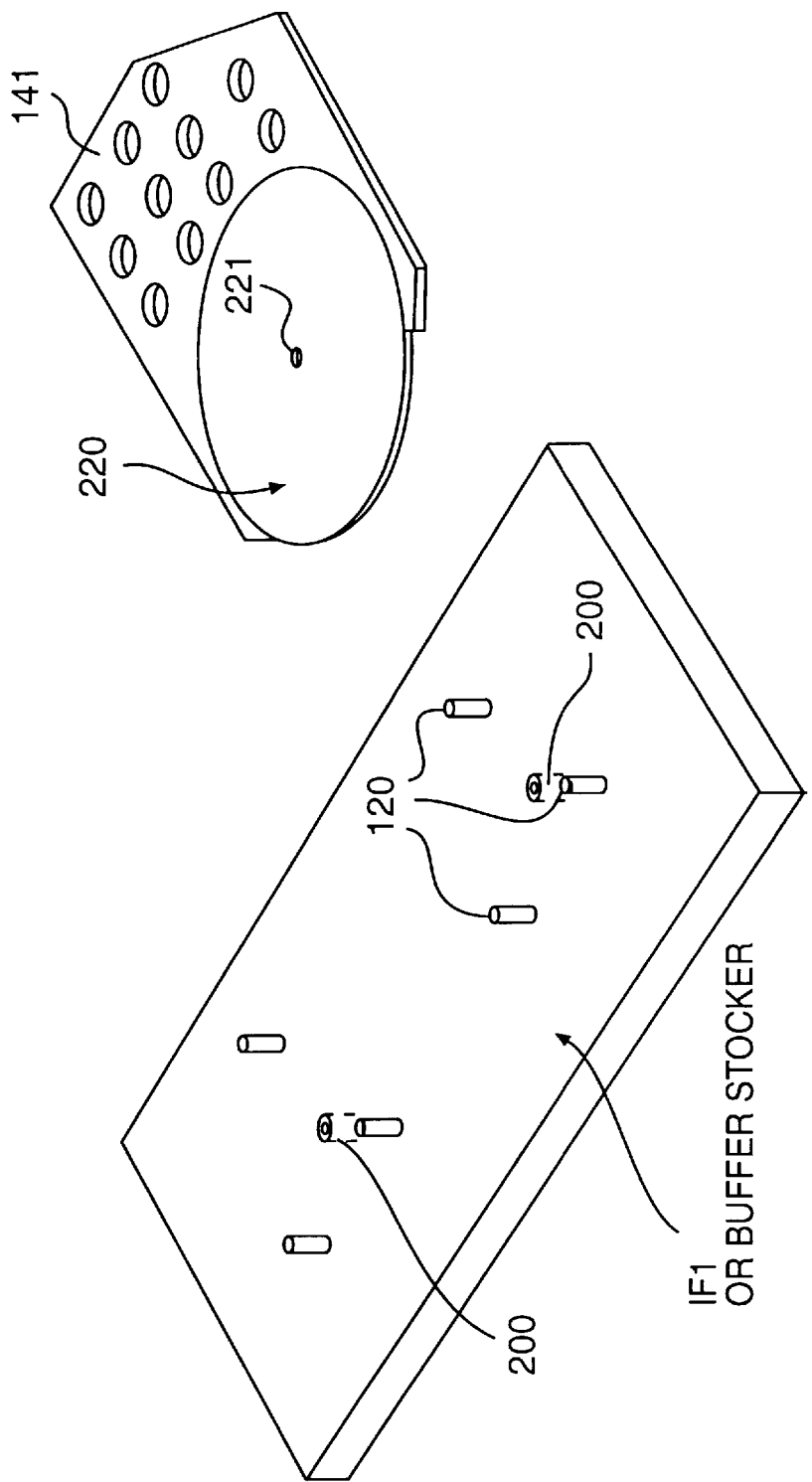
FIG. 9 is a perspective view illustrating means for setting a wafer loading position of each wafer feeding arm in accordance with the present invention.

Meanwhile, it is important to accurately load a wafer W on a desired position when the wafer W is loaded on the first interface or buffer stocker using the feeding robot provided with the wafer feeding arms 141 and 142. In particular, the first interface and buffer stocker are arranged at positions preventing the user from directly observing those units with the naked eye. To this end, a reflex sensor 200 is provided, as a means for accurately setting a desired wafer loading position, in accordance with the present invention. As shown in FIG. 9, the reflex sensor 200 is arranged on the plate of each processing unit, which is a bake unit 10 in the case illustrated in FIG. 9, at a position corresponding to the center of a wafer accurately loaded on the plate. In other words, the reflex sensor 200 is arranged in such a fashion that it radiates a light beam onto the center of the lower surface of the accurately loaded wafer. A jig wafer 220 is also used to accurately determine a desired wafer loading position. A through hole 221 is formed through the central portion of the jig wafer 220 so that the light beam emitted from the reflex sensor 200 passes through the through hole 221 when the jig wafer 220 is accurately loaded at a desired wafer loading position on the plate by the feeding robot. Accordingly, the wafer loading position of the feeding robot can be accurately set to correspond to a desired wafer loading position by determining whether the light beam emitted from the reflex sensor 200 transmits through the jig wafer 220 loaded by the feeding robot or reflects from the jig wafer 220.

That is, the jig wafer 220 is first loaded on the plate by the wafer feeding arm 141 or 142 of the feeding robot, at the initial stage of the wafer loading operation. In this state, it is determined whether or not the light beam emitted from the reflex sensor 200 transmits through the jig wafer 220 or reflects from the jig wafer 220. Based on a signal from the reflex sensor 200 indicative of the result of the above determination, the wafer loading position of the feeding robot is adjusted so that it corresponds to a desired wafer loading position where the light beam transmits through the jig wafer 220. Thus, the wafer loading position of the feeding robot is accurately set. After completing the setting operation, the jig wafer 220 is removed so as to carry out a continuous feeding operation for wafers to be processed.

Figure 10:
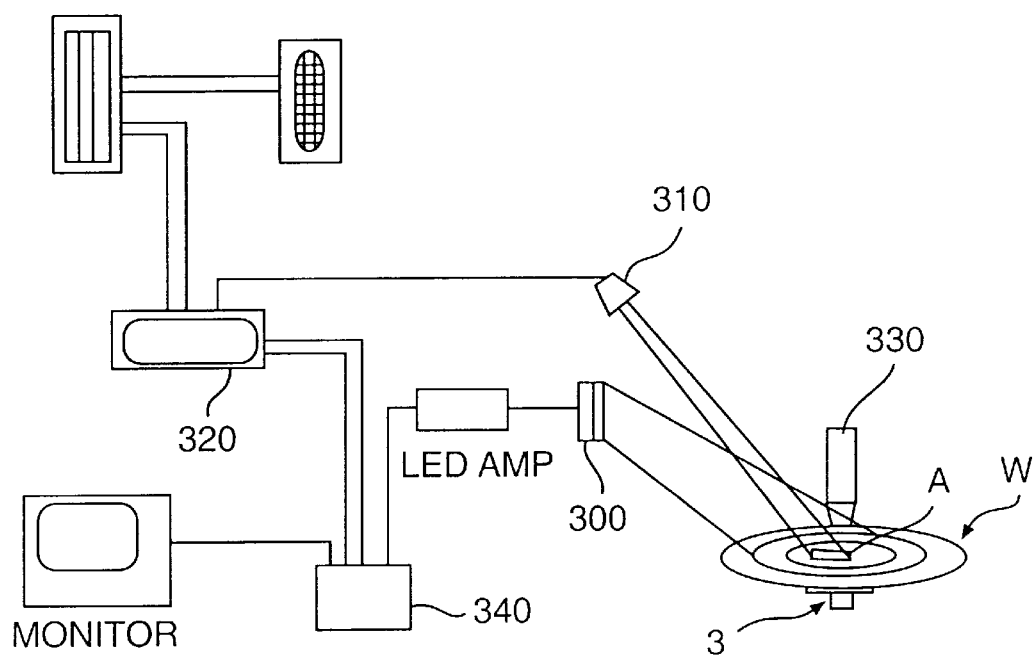
FIG. 10 is a block diagram illustrating an apparatus for controlling the supply of a coating solvent upon coating a photoresist solution over the surface of a wafer in accordance with the present invention.

FIG. 10 illustrates an apparatus for controlling the supply of a coating solvent upon coating a photoresist solution over the surface of a wafer by the spin coater prior to the baking process. As shown in FIG. 10, the coating solvent supply control apparatus includes a lamp 300 for irradiating an LED light beam onto the central portion of a wafer W loaded on the spin coater and rotated by the spin coater. A CCD camera 310 is arranged in the vicinity of the lamp 300 in such a fashion that it is focused onto an observation area A on the wafer W. A CCD controller 320 is coupled to the CCD camera 310. The CCD controller 320 serves to control the turn-on and turn-off of the lamp 300 during a low-speed rotation of the spin coater 3. The CCD controller 320 also recognizes an initial contrast of the wafer W and checks, based on the recognized initial contrast, a variation in contrast occurring in the observation area A when a coating solvent injected onto the surface of the wafer is diffused along the wafer surface. The CCD controller 320 detects such a variation in contrast in the form of an image. A main controller 340 is coupled to the CCD controller 320. The main controller 340 receives an image signal from the CCD controller 320, which signal is indicative of a variation in contrast detected by the CCD controller 320. Based on the received image signal, the main controller 340 controls the operations of a variety of operating units including the lamp 300, CCD camera 310, a nozzle 330 adapted to inject the coating solvent, etc.

Accordingly, the coating solvent supply control apparatus having the above configuration detects the coated or injected state of the coating solvent, thereby controlling the supply of the coating solvent while controlling the rotating operation of the spin coater 3. Therefore, it is possible to achieve a stable photoresist coating while using a reduced amount of solvent. Since there is no excessive consumption of solvent, it is also possible to reduce the costs. In accordance with the configuration of the coating solvent supply control apparatus, it is easy to vary the position of the observation area where the coated or injected state of the coating solvent is detected. It is also possible to reduce the time taken for the setting and change of detection conditions. As a result, various limitations, which result from the characteristics of the solvent used and the surface condition of the wafer, can be completely eliminated.

Figure 11:
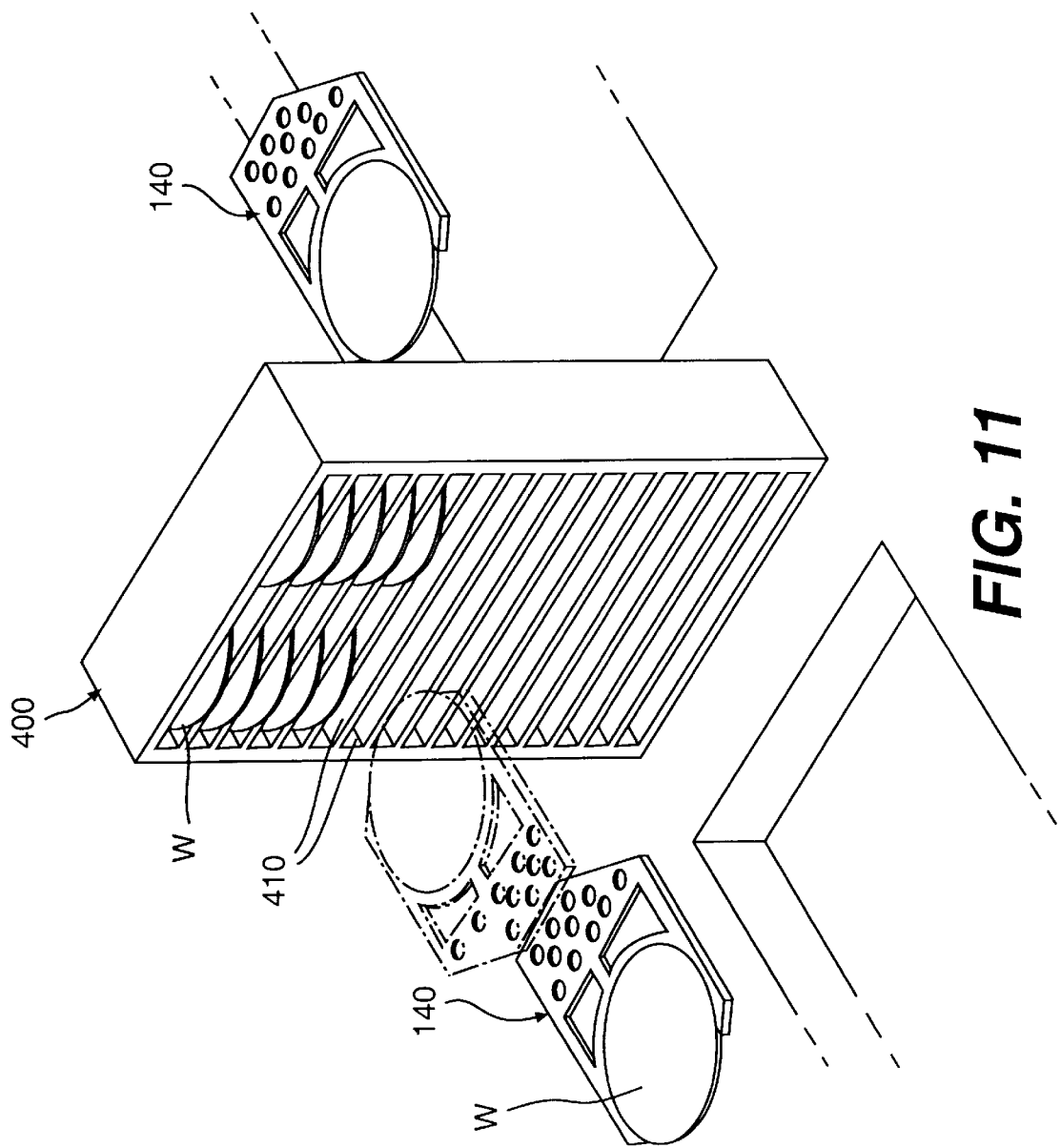
FIG. 11 is a perspective view illustrating a stocker arranged between the spinner and a stepper in accordance with the present invention.

Referring to FIG. 11, a stocker 400 is illustrated which is provided at the second interface IF2 arranged between the spinner, in which a baking process is carried out, and the stepper 70. Wafers W completely processed by the photoresist coating and developing processes are stocked in the stocker 400 of the second interface IF2. In order to store those wafers, the stocker 400 has a plurality of stock compartments 410 arranged in a multi-layered fashion. Each stock compartment 410 is open at both sides thereof so as to allow wafers to have access to the stock compartment 410 at both sides of the stock compartment 410. A pair of wafer feeding arms, which are denoted by the reference numeral 140, are arranged at both sides of the stocker 400, respectively, in order to stock wafers in the stocker 400 at both sides of the stocker 400.

Since the stocker 400, which is arranged between the spinner and second interface IF2, has a configuration capable of achieving simultaneous stocking or removal of wafers at both sides of the stocker 400, it is possible to more rapidly stock wafers continuously fed to the stocker 400 without any wafer pileup phenomenon. Accordingly, an improvement in productivity is achieved.

Thus, the present invention, which is adapted to configure the spinner itself and various units of the spinner to have multi-layered arrangements, is an epochal technique capable of achieving improvements in system installation, manufacturing processes, and system and process management, taking into consideration the fact that the entire installation volume and the number of processing units increase inevitably due to the use of new techniques coping with the enlargement of the standard (diameter) of wafers from the size of 6 or 8 inch to the size of 12 to 16 inch.

Although the numbers of bake units and spin units such as spin coaters and spin developers increase, it is possible to effectively increase the utility of the entire occupying space by virtue of the multi-layered arrangements of those installations according to the present invention. The movement range of each feeding robot for each processing unit can also be reduced. This results in a reduction in the operating load and time of the feeding robot.

As apparent from the above description, the present invention provides a semiconductor wafer processing system including wafer processing units arranged in a multi-layered fashion, thereby being capable of achieving a reduction in the occupying space of the entire installation. The semiconductor wafer processing system also has a configuration capable of achieving accurate wafer feeding and loading operations, and reducing the consumption of a chemical solvent coated over wafers. Accordingly, the present invention provides an economical and efficient semiconductor wafer processing system capable of achieving an improvement in productivity.

In accordance with the present invention, even when it is required to increase the number of processing units used or to introduce a new installation due to the use of new techniques, it is possible to minimize the occupying space of the entire system by virtue of the multi-layered arrangement of those processing units. In addition, the operating load and time of robots operatively associated with processing units can be reduced.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor wafer processing system comprising:
    a first robot arranged downstream, in a feeding direction of wafers being processed, from an indexer carrying out wafer loading and unloading operations and adapted to feed a wafer loaded in the indexer to a desired one of processing units;
    a first group of modules arranged in opposite sides of the first robot, the modules of the first module group being selected from first and second modules;
    a second robot arranged downstream from the first robot in the wafer feeding direction via a first interface in such a fashion that it is aligned with the first robot in the wafer feeding direction;
    a second group of modules arranged in opposite sides of the second robot, the modules of the second module group being selected from the first and second modules; and
    a stepper arranged downstream from the second robot via a second interface in the wafer feeding direction and adapted to expose to light the entire portion of a wafer coated with a photoresist and fed thereto.

2. The semiconductor wafer processing system according to claim 1, wherein:
    each of the first modules comprises a plurality of bake units each having a plurality of bake boxes arranged in a multi-layered fashion, the bake units being arranged in such a fashion that they are adjacent to one another in the wafer feeding direction, and a spin unit fixedly mounted on the bake units, the spin unit comprising a spin coater or a spin developer; and
    each of the second modules comprises a plurality of wafer edge exposure units arranged in a multi-layered fashion while being arranged in such a fashion that they are adjacent to one another in the wafer feeding direction, each of the wafer edge exposure units serving to expose to light an unnecessary portion of the photoresist disposed on the peripheral edge portion of each wafer, and a spin unit fixedly mounted on the wafer edge exposure units, the spin unit comprising a spin coater or a spin developer.

3. The semiconductor wafer processing system according to claim 2, wherein each of the bake boxes comprises a pair of thermal plates arranged side by side with each other, each of the thermal plates being selected from a hot plate adapted to heat a wafer and a cool plate adapted to cool a wafer in such a fashion that the thermal plates of each bake box have the same type or different types, respectively.

4. The semiconductor wafer processing system according to claim 1, wherein:

the modules of each of the module groups are also arranged in a multi-layered fashion to form at least two module layers and have the same module type or a combination of different module types;

each of the module groups constitutes a station, together with feeding means; and a feeding interface or buffer stocker is arranged between adjacent stations respectively associated with the module groups.

5. The semiconductor wafer processing system according to claim 3, further comprising:

a plurality of support pins extending through vertical holes provided at each thermal plate of each of the bake units in such a fashion that they move vertically through the vertical holes while supporting a wafer thereon;

a cylinder for vertically moving the support pins between a loading position, in which the wafer supported by the support pins is loaded on the thermal plate, and an unloading position, in which the wafer is unloaded from the thermal plate;

a feeding robot arranged in the vicinity of the bake units, the feeding robot serving to carry out loading and unloading operations for wafers with respect to each of the bake units; and a feeding arm arranged in a space defined between the thermal plates of each of the bake units and independently driven by separate drive means in such a fashion that it moves pivotally between the thermal plates, the feeding arm being provided at a free end thereof with a wafer holding member adapted to hold a wafer loaded in the bake unit.

6. The semiconductor wafer processing system according to claim 5, further comprising:

a position sensor arranged in the vicinity of the support pins associated with each of the thermal plates and adapted to sense a moved position of the support pins; and a controller coupled to the position sensor and adapted to control the cylinder, based on an output signal from the position sensor, in such a fashion that the support pins supporting a wafer move at a high speed at an initial stage of a downward movement thereof for loading the wafer on the associated thermal plate and at a low speed at a stage of the downward movement thereof just before the wafer comes into contact with the thermal plate while moving at a high speed when they are separated from the wafer.

7. The semiconductor wafer processing system according to claim 5, further comprising:

a cover member arranged above each of the thermal plates in such a fashion that it moves vertically with respect to the thermal plate, thereby opening and closing the thermal plate; and a cylinder adapted to move the cover member between a position, where the cover member opens the thermal plate, and a position, where the cover member closes the thermal plate, the cylinder operating independently of the cylinder adapted to drive the support pins.

8. The semiconductor wafer processing system according to claim 5, wherein the feeding robot comprises a pair of wafer feeding arms each adapted to feed a wafer to a desired position while holding the wafer, one of the wafer feeding arms having a plate shape and serving to support a peripheral portion of the wafer with the other wafer feeding arm having a bar shape and serving to support a portion of the wafer extending diametrically through the center of the wafer, so that a selected one of the wafer feeding arms operates to feed the wafer in accordance with the characteristics of a processing unit, in which the wafer is loaded.

9. The semiconductor wafer processing system according to claim 8, further comprising means for setting a wafer loading position of the feeding robot, the means comprising:

a reflex sensor arranged on an upper surface of each bake unit at a position corresponding to the center of a wafer accurately loaded on the upper surface of the bake unit in such a fashion that it radiates a light beam onto the center of the accurately loaded wafer; and a jig wafer loaded in the bake unit by the feeding robot when it is desired to set a wafer loading position of the feeding robot, the jig wafer being provided at a central portion thereof with a through hole allowing a light beam to transmit therethrough;

whereby the wafer loading position of the feeding robot is accurately set to correspond to a desired wafer loading position, based on a signal, generated from the reflex sensor, indicative of whether a light beam emitted from the reflex sensor transmits through the through hole of the jig wafer loaded by the feeding robot or reflects from the jig wafer.

10. The semiconductor wafer processing system according to claim 1, further comprising:

a stocker provided at the second interface arranged between a spinner, in which a baking process is carried out, and the stepper, the stocker having a plurality of stock compartments arranged in a multi-layered fashion and adapted to stock wafers completely processed by photoresist coating and developing processes; and a pair of wafer feeding arms arranged at opposite sides of the stocker, respectively, to stock wafers in the stock compartments of the stocker at the opposite sides of the stocker.

11. The semiconductor wafer processing system according to claim 2, wherein:

the modules of each of the module groups are also arranged in a multi-layered fashion to form at least two module layers and have the same module type or a combination of different module types;

each of the module groups constitutes a station, together with feeding means; and a feeding interface or buffer stocker is arranged between adjacent stations respectively associated with the module groups.

12. The semiconductor wafer processing system according to claim 5, further comprising:

a stocker provided at the second interface arranged between a spinner, in which a baking process is carried out, and the stepper, the stoker having a plurality of stock compartments arranged in a multi-layered fashion and adapted to stock wafers completely processed by photoresist coating and developing processes; and a pair of wafers feeding arms arranged at opposite sides of the stocker, respectively, to stock wafers in the stock compartments of the stocker at the opposite sides of the stocker.

13. The semiconductor wafer processing system according to claim 6, further comprising:

a stocker provided at the second interface arranged between a spinner, in which a baking process is carried out, and the stepper, the stoker having a plurality of stock compartments arranged in a multi-layered fashion and adapted to stock wafers completely processed by photoresist coating and developing processes; and a pair of wafers feeding arms arranged at opposite sides of the stocker, respectively, to stock wafers in the stock compartments of the stocker at the opposite sides of the stocker.

14. The semiconductor wafer processing system according to claim 7, further comprising:

a stocker provided at the second interface arranged between a spinner, in which a baking process is carried out, and the stepper, the stoker having a plurality of stock compartments arranged in a multi-layered fashion and adapted to stock wafers completely processed by photoresist coating and developing processes; and a pair of wafers feeding arms arranged at opposite sides of the stocker, respectively, to stock wafers in the stock compartments of the stocker at the opposite sides of the stocker.

15. The semiconductor wafer processing system according to claim 8, further comprising:

a stocker provided at the second interface arranged between a spinner, in which a baking process is carried out, and the stepper, the stoker having a plurality of stock compartments arranged in a multi-layered fashion and adapted to stock wafers completely processed by photoresist coating and developing processes; and a pair of wafers feeding arms arranged at opposite sides of the stocker, respectively, to stock wafers in the stock compartments of the stocker at the opposite sides of the stocker.

16. A semiconductor wafer processing system comprising means for controlling the amount of a coating solvent supplied when a photoresist solution is coated over a wafer, the means comprising:

a lamp for irradiating an LED light beam onto a central portion of a wafer loaded on a spin coater and rotated by the spin coater;

a CCD camera arranged in the vicinity of the lamp in such a fashion that it is focused onto an observation area defined on the wafer;

a CCD controller coupled to the CCD camera, the CCD controller controlling turn-on and turn-off states of the lamp during a low-speed rotation of the spin coater, recognizing an initial contrast of the wafer, checking, based on the recognized initial contrast, a variation in contrast occurring in the observation area when the coating solvent injected onto the wafer is diffused along the wafer, and detecting the variation in contrast in the form of an image; and a main controller coupled to the CCD controller, the main controller receiving an image signal, generated from the CCD controller, indicative of the variation in contrast detected by the CCD controller, and controlling the operations of a variety of operating units including the lamp, the CCD camera and a nozzle adapted to inject the coating solvent.

* * * * *